US012587187B2

(12) United States Patent
Summerland et al.

(10) Patent No.: US 12,587,187 B2
(45) Date of Patent: Mar. 24, 2026

(54) CIRCUIT AND DEVICE INCLUDING A TRANSISTOR AND DIODE

(71) Applicant: Search For The Next, LTD., Nottingham (GB)

(72) Inventors: David Summerland, Nottingham (GB); Roger Light, Nottingham (GB); Luke Knight, Nottingham (GB)

(73) Assignee: University of Nottingham Innovation Park, Nottingham (GB)

( * ) Notice: Subject to any disclaimer, the term of this patent is extended or adjusted under 35 U.S.C. 154(b) by 53 days.

(21) Appl. No.: 18/436,339

(22) Filed: Feb. 8, 2024

(65) Prior Publication Data

US 2024/0250683 A1     Jul. 25, 2024

Related U.S. Application Data

(62) Division of application No. 17/059,789, filed on Nov. 30, 2020, now Pat. No. 11,929,741.

(51) Int. Cl.
| | |
|---|---|
| *H03K 17/567* | (2006.01) |
| *H03K 19/084* | (2006.01) |
| *H10D 84/60* | (2025.01) |

(52) U.S. Cl.
CPC ......... *H03K 17/567* (2013.01); *H03K 19/084* (2013.01); *H10D 84/619* (2025.01)

(58) Field of Classification Search
None
See application file for complete search history.

(56) References Cited

U.S. PATENT DOCUMENTS

| | | | |
|---|---|---|---|
| 4,962,341 A | 10/1990 | Schoeff | |
| 11,929,741 B2 | 3/2024 | Summerland | |
| 2006/0125054 A1* | 6/2006 | Kim ......................... | H10D 8/80 257/607 |
| 2021/0211125 A1 | 7/2021 | Summerland | |

FOREIGN PATENT DOCUMENTS

EP          0430063          6/1991

OTHER PUBLICATIONS

International Search Report issued Aug. 15, 2019 in PCT/GB2019/051465.
Written Opinion of the International Searching Authority dated May 12, 2019 in PCT/GB2019/051465.
International Preliminary Report on Patentability dated Dec. 1, 2020 in PCT/GB2019/051465.

* cited by examiner

*Primary Examiner* — Crystal L Hammond
(74) *Attorney, Agent, or Firm* — Fleit Intellectual Property Law; Jose Gutman

(57)          ABSTRACT
An inverter logic circuit includes a bipolar junction transistor and a zener diode. The zener diode is connected between the base of the bipolar junction transistor and ground (or other reference voltage). The zener diode is reverse biased such that a leakage current through the zener diode allows for sufficient current through the emitter-base terminals of the bipolar junction transistor when a voltage is applied across the emitter and base terminals of the bipolar junction transistor to turn the transistor ON in the absence of an external signal to the base. As such the bipolar junction transistor functions as a normally ON bipolar junction transistor.

9 Claims, 7 Drawing Sheets

CIRCUIT AND DEVICE INCLUDING A TRANSISTOR AND DIODE

BACKGROUND

The present application generally relates to a "normally ON" switchable transistor device and associated circuit, and more particularly in various embodiments to a semiconductor circuit including a "normally ON" transistor device and associated circuit including a diode device, which can switch the transistor device "OFF" or "ON" such that when the transistor is switched "OFF" a current through the transistor is reduced to a substantially zero value over a wide temperature range.

The use of a "normally ON" transistor, namely where the transistor functions in an ON state in the absence of a signal applied to the base is desirous for the formation of digital logic circuits as they allow for the construction of logic gates without need for complementary transistors, halving the transistor count.

It is known that a NPN bipolar junction transistor (BJT) can be operated as a normally ON transistor through a circuit configuration in which the base of the BJT is connected to ground through a resistor. When a voltage is applied across the emitter and base terminals of the BJT, the emitter being more positive, a current can flow out of the base terminal and through the resistor. This allows for current flow between the emitter and collector terminals of the transistor, in other words the transistor is ON. To turn OFF the transistor the base of the transistor is connected to a current source able to provide sufficient current through the resistor that the current through the transistor drops sufficiently (or stops) such that current flow between the emitter and collector ceases.

The temperature coefficients of resistors are typically large. This makes it difficult to provide the aforementioned circuit with operationally stability over a wide range of temperatures. Further, the resistance value (ohms) of the resistor must be large to be sufficiently current limiting that the transistor can be switched OFF with the maximum current available from the current source. Resistors with values that meet this requirement are physically relatively large. For these reasons it is impracticable to use this circuit design in many integrated circuits (IC).

BRIEF SUMMARY

According to a first aspect of the invention there is provided a circuit comprising: a bipolar transistor, a base terminal of the bipolar transistor being switchably connectable to a signal source; a diode having a first terminal connected to the base terminal of the transistor, and a second terminal connected to a reference voltage; the circuit arranged such that when the signal source is not connected to the base terminal of the transistor, a voltage applied at an emitter terminal of the bipolar transistor causes a current flow through the base terminal of the transistor and through the diode such that the transistor is in an ON state; the impedance of the signal source being lower than the impedance of the transistor through the emitter and base terminals; and the diode being selected to provide a current limiting function such that when the signal source is connected to the base of the transistor, current flow through the base terminal reduces such that the transistor switches to an OFF state.

The diode provides the current limiting function of a large resistor of the prior art circuit; however, the diode, unlike a resistor, is a relatively small electronic component and therefore makes the circuit more feasible for use in implementing digital logic circuits.

The current limiting function of the diode provides a convenient means to restrict current flow through the base-emitter terminals of the transistor when ON to allow for a relatively small potential drop across the emitter base of the transistor. This leads to a small change in the voltage of the base transistor (relative to reference voltage) when the transistor switched between OFF and ON reduces the differ likelihood of the formation of parasitic effects between bases of neighboring transistor formed within a semiconductor device.

The diode may provide the current limiting function in one or more ways. A diode may be selected of a physical size that provides the required resistance; the smaller the diode the more limited its current carrying capacity. Alternatively or additionally the diode may be arranged in the circuit to be reversed biased when the voltage is applied across an emitter terminal of the transistor and the second terminal of the diode. This latter method is preferred, especially where larger diodes are to be used.

The diode circuit may be operated such that the diode is reversed biased with a voltage across the diode that is below its breakdown voltage. When reverse biased, current flow through the diode may be a result of a leakage current due to quantum tunneling.

The diode may be a zener diode. Compared with many other types of diode, zener diodes, when biased below their zener voltage (breakdown voltage), operate reliably compared with other diodes. Nevertheless, alternative diodes may be used such as, for example, a tunnel diode which may be operated in forward bias.

Favorably the modulus of the temperature coefficient of the diode is less or equal to 2 mV per degree Celsius. More favorably the diode has a temperature coefficient of approximately 0 mV per degree Celsius as this provides the greatest degree of operational stability with changes in temperature.

To provide this temperature coefficient it is preferred that the diode is a zener diode selected to exhibit a zener voltage less than or equal to about 5.6V and more favorably about 5.6V.

The bipolar junction transistor may be of PNP or NPN form. With PNP form the voltage across the emitter and second terminal of the diode is arranged such that conventional current flows from the emitter, through the transistor out of the base terminal and into the diode, and that the signal source is a current source. With the NPN form the voltage across the emitter and second terminal of the diode is arranged such that conventional current flows from the second terminal of the diode, through the diode, into the base terminal and out through the emitter, and that the signal source is a current sink.

The circuit finds particular utility in the implementation of a logic gate, for example as an inverter logic gate that outputs a voltage representing the opposite logic level to an input connected to the base of the transistor. Multiple of the aforementioned circuits as variously described above, may be connected together in order to implement logic gates that perform other logical operations.

According to another aspect of the invention there is provided a method of operating a circuit; the circuit comprising a bipolar transistor, a diode having a first terminal connected to the base terminal of the transistor; and a second terminal of the diode connected to a reference voltage; a voltage being applied across an emitter terminal of the transistor and the second terminal of the diode; the method comprising switchably connecting the base terminal of the transistor and the first terminal of the diode to a signal source having an impedance lower than the impendence across the emitter and base terminals of the bipolar transistor such that: when not connected so as to cause a current flow through the base terminal of the transistor and through the diode to turn the transistor ON; and when connected current flow through the control terminal of the transistor reduces to switch the transistor OFF.

According to another aspect of the invention there is provided a semiconductor device comprising: a bipolar transistor comprised from: a first and second regions of a first type of semiconductor material that provide collector and emitter regions of the transistor, and a first region of a second type that provides a base region of the transistor, interposed between and in contact with each of the first and second regions of the first type; and a diode comprised from: the first region of the second type; and a further region of the first type of semiconductor in contact with the relatively highly doped portion of the first region of the second type to form a diode junction.

This structure provides a convenient means of forming the circuit described above as the semiconductor region that provides the base of the transistor also provides one of the regions that provide the diode's PN junction.

The diode may be comprised from a portion of the first region of the second type that is relatively highly doped compared with the remainder of the first region of the second type.

The portion of the first region of the second type that is relatively highly doped and the further region of the first type of semiconductor may provide a zener diode.

The transistor may be a lateral bipolar junction transistor, the first and second regions of the first type being laterally spaced apart from one another about the first region of the second type and lie on the same side as the first region of the second type.

The semiconductor device may comprise an electrical terminal connected to the further region of the first type of semiconductor that provides a terminal of the diode.

The further region of the first type of semiconductor may be provided, at least in part, by a semiconductor layer that has been deposited onto a semiconductor wafer which defines, at least in part, the first region of a second type that provides a base region of the transistor. This provides a convenient means of providing these regions without the need for counter-doping the base region, though counter-doping albeit less preferable could be used instead.

The first and second regions of a first type of semiconductor material may be provided by a semiconductor layer deposited onto a semiconductor wafer which defines, at least in part, the first region of a second type that provides a base region of the transistor. Again this provides advantages of counter-doping the silicon wafer.

The semiconductor device may comprise a base contact for the transistor, the base contact being in direct contact with the relatively highly doped portion of the first region of the second type.

The semiconductor device may comprise a contact terminal for the diode that is in direct contact with the further region of the first type of semiconductor.

The further region of the first type of semiconductor may comprise a first portion that is relatively highly doped which together with the first region of the second type provides the diode; and a second portion which is relatively lightly doped relative the first portion and provides a substrate layer.

The semiconductor device may comprise multiple first regions of the second type within the substrate layer and isolated from one another by the substrate layer. In this way, multiple transistor-diode devices may be formed on a single wafer.

BRIEF DESCRIPTION OF THE SEVERAL VIEWS OF THE DRAWINGS

The invention will now be described by way of example with reference to the following figures in which.

DETAILED DESCRIPTION

Figure 1:
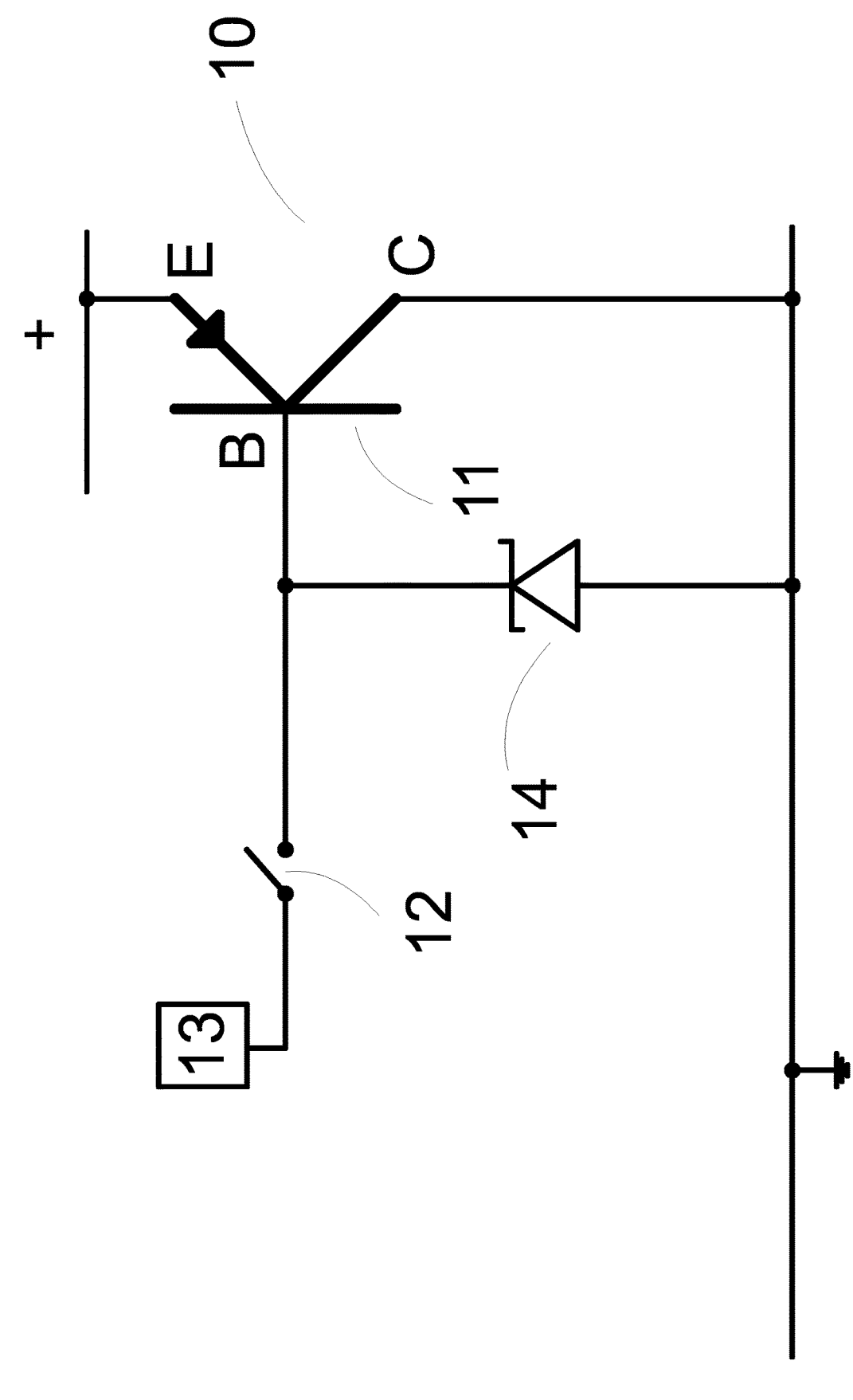
FIG. 1 is a schematic of an example circuit comprising a PNP bipolar junction transistor and a reversed biased zener diode, which implements an inverter logic gate (NOT gate)

With reference to FIG. 1 there is shown a circuit 10 comprising a PNP bipolar junction transistor 11. The emitter E of the transistor is connected to the high side rail and the collector of the transistor C connected to ground or some other low side reference voltage. The base B of the transistor 110 is switchably connectable through switch 12 to a current source 13.

A first terminal of a zener diode 14 is connected to both the base B of the transistor 11 and the current source 13 through switch 12. A second terminal of the diode 14 is connected to ground or some other low side reference voltage. The zener diode 14 is oriented such as to be reverse biased. A zener diode 14 is chosen with a zener voltage of about 5.6V in order that it has a temperature coefficient as close as possible to 0 mV per degree Celsius. This ensures the diode's characteristics remain stable with any change in the diode's temperature, e.g., as a result of external conditions.

With switch 12 open, such that the current source 13 is isolated from the base terminal B, there is a voltage drop across the transistor 11 and diode 14, and hence conventional current flow through the emitter base terminals of the transistor 11 and through the reverse biased diode 14; current flow through the diode 14 attributable to a leakage current.

The circuit 10 is arranged such that the voltage drop across the diode 14 is below the breakdown voltage of the diode 14. The leakage current thus though to be a consequence of quantum tunneling effect within the diode 14.

The diode 14 is selected that, for the expected voltage drop across it, there is sufficient leakage current flows through it and therefore also between the emitter E and base B of the transistor to allow for current flow between the emitter E and collector C of the transistor 11; i.e., the transistor is ON.

Additionally, it is preferable that the diode is selected that, for the expected voltage across it, the leakage current flow is kept as low as possible whilst ensuring the transistor is ON. This has the advantage of reducing the voltage drop across the transistor when the transistor is ON and therefore reduces the change in potential of the base of the transistor (relatively to ground or some reference voltage) when the transistor is switched between OFF and ON. This minimizes static fields between transistors formed in the same wafer. In one example it is preferred that the switching voltage across the transistor is limited to around 0.5V.

When the switch 12 is closed the current source is connected to the base terminal B of the transistor 11. The impedance of the current source is selected to be lower than the impedance through the emitter base terminals of the transistor 11 causing the diode 14 to preferentially draw current from the current source 13 rather than the base B of the transistor 11. This results in current through the emitter-base of the transistor 11 reducing, e.g., substantially to zero, such that current between the emitter and collector reduces, if not ceases, to an extent that it the transistor is considered OFF.

In order to ensure that current through the transistor 11 reduces when the switch 12 is closed, the diode 14 needs to be current limiting, i.e., it does not have the capacity to carry the maximum current that can be supplied by the current source 13 as well as the current from the transistor 11.

In the afore described circuit arrangement the transistor 11 can be treated as operating as a normally ON transistor as the transistor is ON when there is no signal applied to the base.

The example circuit of FIG. 1 can be used to implement an inverter (NOT) logic gate. When the base is connected to a signal source (input ON), i.e., the current source 13, current flow at the collector side of the transistor 11 will be substantially zero (output OFF). In contrast when the base is disconnected from the signal source (input OFF) there will be current through the collector (output ON).

Figure 2:
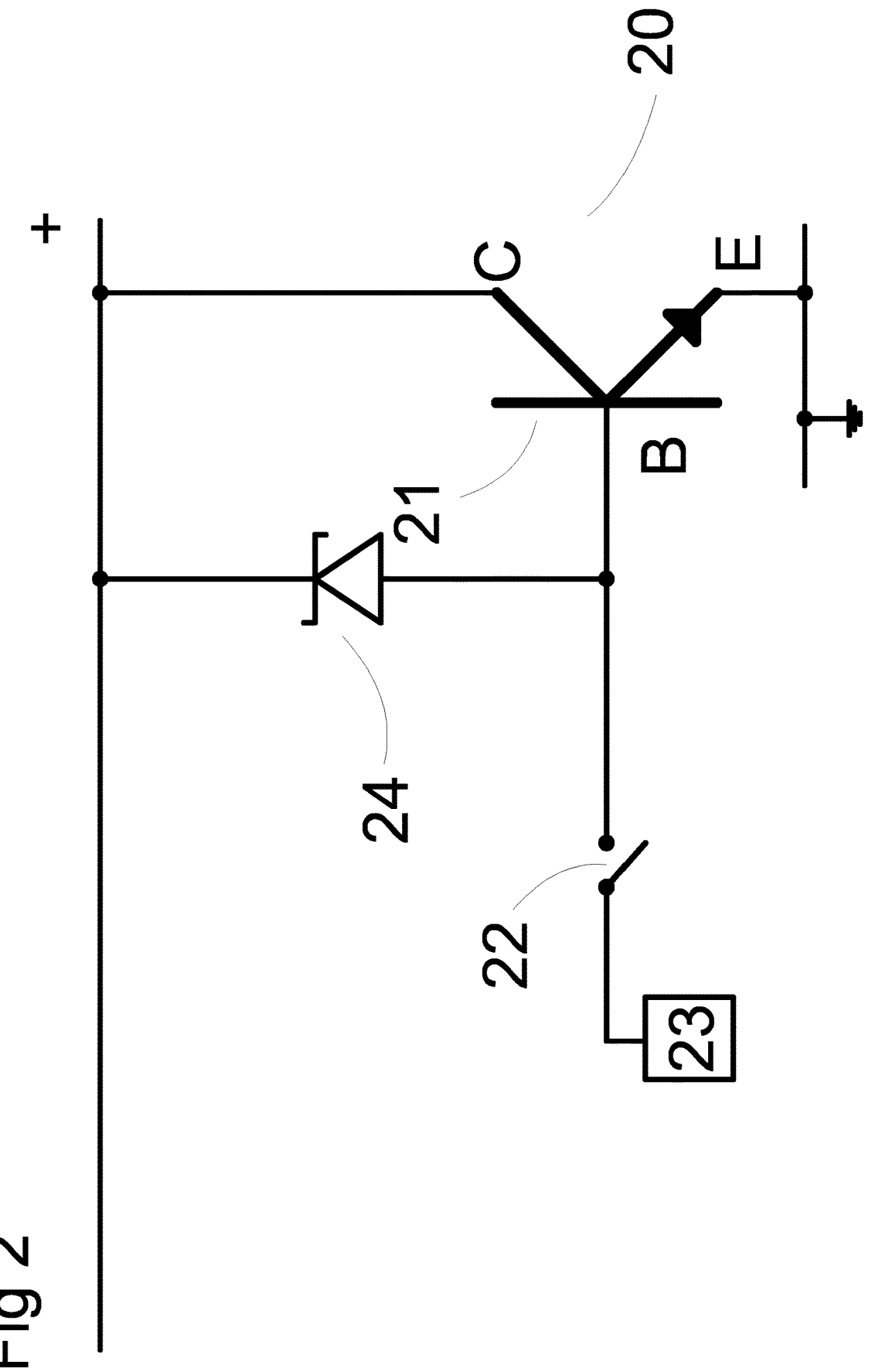
FIG. 2 is a schematic of an example circuit comprised from a NPN bipolar junction transistor and a reversed biased zener diode, which implements the function of an inverter logic gate (NOT gate)

FIG. 2 illustrates a variant example circuit 20 that implements the same function as the circuit of FIG. 1 but in which the PNP bipolar transistor is replaced with an NPN bipolar transistor. The circuit 20 operates in a similar way except that the polarities are reversed and that the current source is replaced with a current sink 23.

When switch 22 is open the potential across the reverse biased diode 24 and transistor 21 causes a leakage current flow through the diode and thus current into the base of the transistor 21 sufficient to switch the transistor ON.

When switch 22 is closed, such that the current sink 23 is connected to the base B of the transistor 21, current through the diode is preferentially drawn through to the current sink 23 by virtue of its lower impendence compared with the impedance of the transistor 21 between the base B and emitter E terminals. As a consequence, current into the base B of the transistor 21 reduces, e.g., ceases, switching the transistor OFF.

FIG. 1 illustrates the current source 13 and switch 12 generically to ease understanding. In most practical implementations the base of the transistor will be connected to the output of another logic circuit(s), with current ultimately derived from the high rail as opposed to an independent current source. Where so, the circuit is designed so that the impedance of the circuitry from the high rail to the base terminal is lower than the impedance between the emitter and the base of the transistor. The same is applied to FIG. 2 mutatis mutandis.

Figure 3:
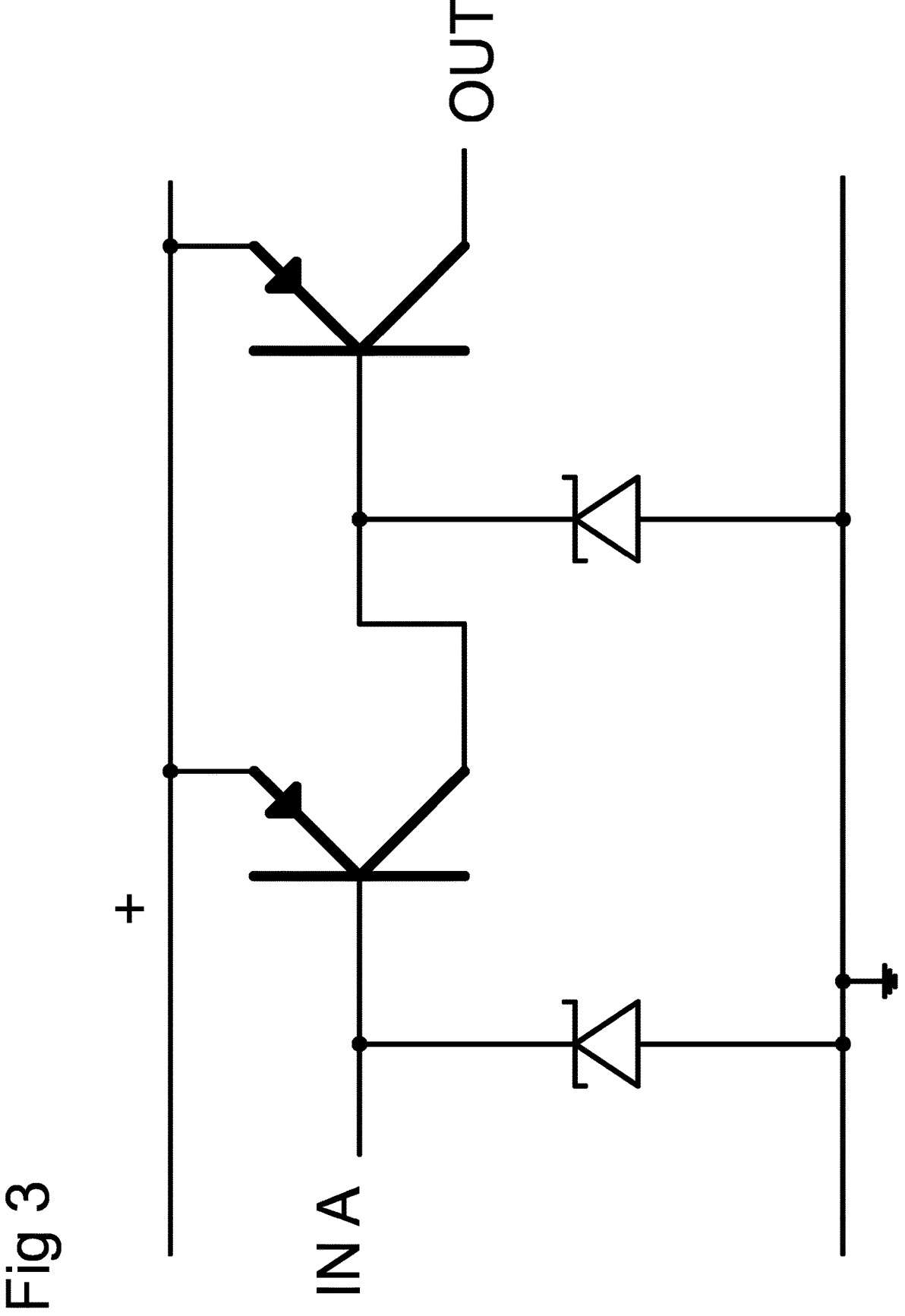
FIG. 3 is a schematic of an example circuit that implements the function of a buffer comprised from two normally ON transistors using two of the circuit fragments of FIG. 1.
Figure 4:
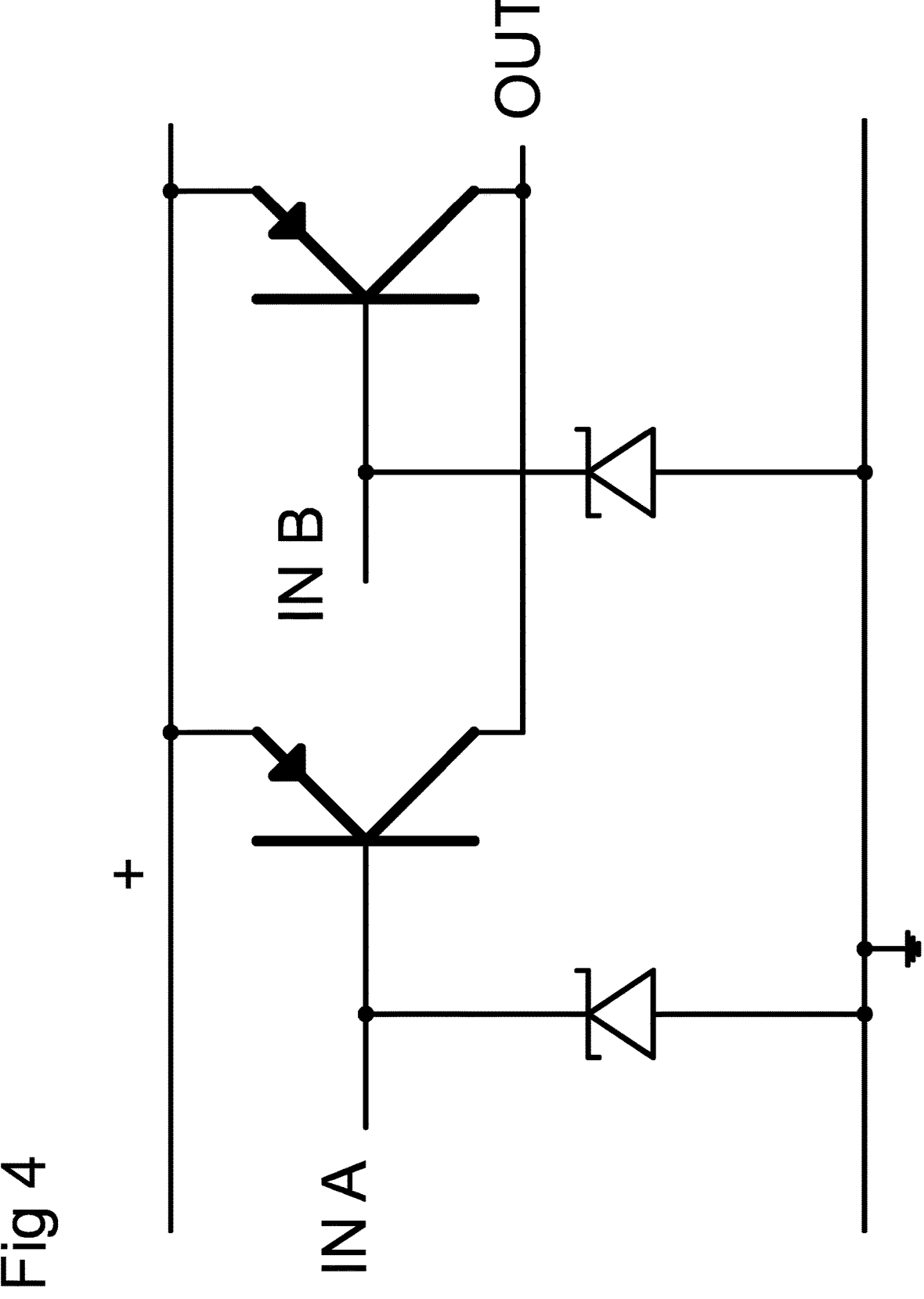
FIG. 4 is a schematic of an example circuit to implement a NAND gate comprised of normally ON transistors implemented using two circuit fragments of FIG. 1.
Figure 5:
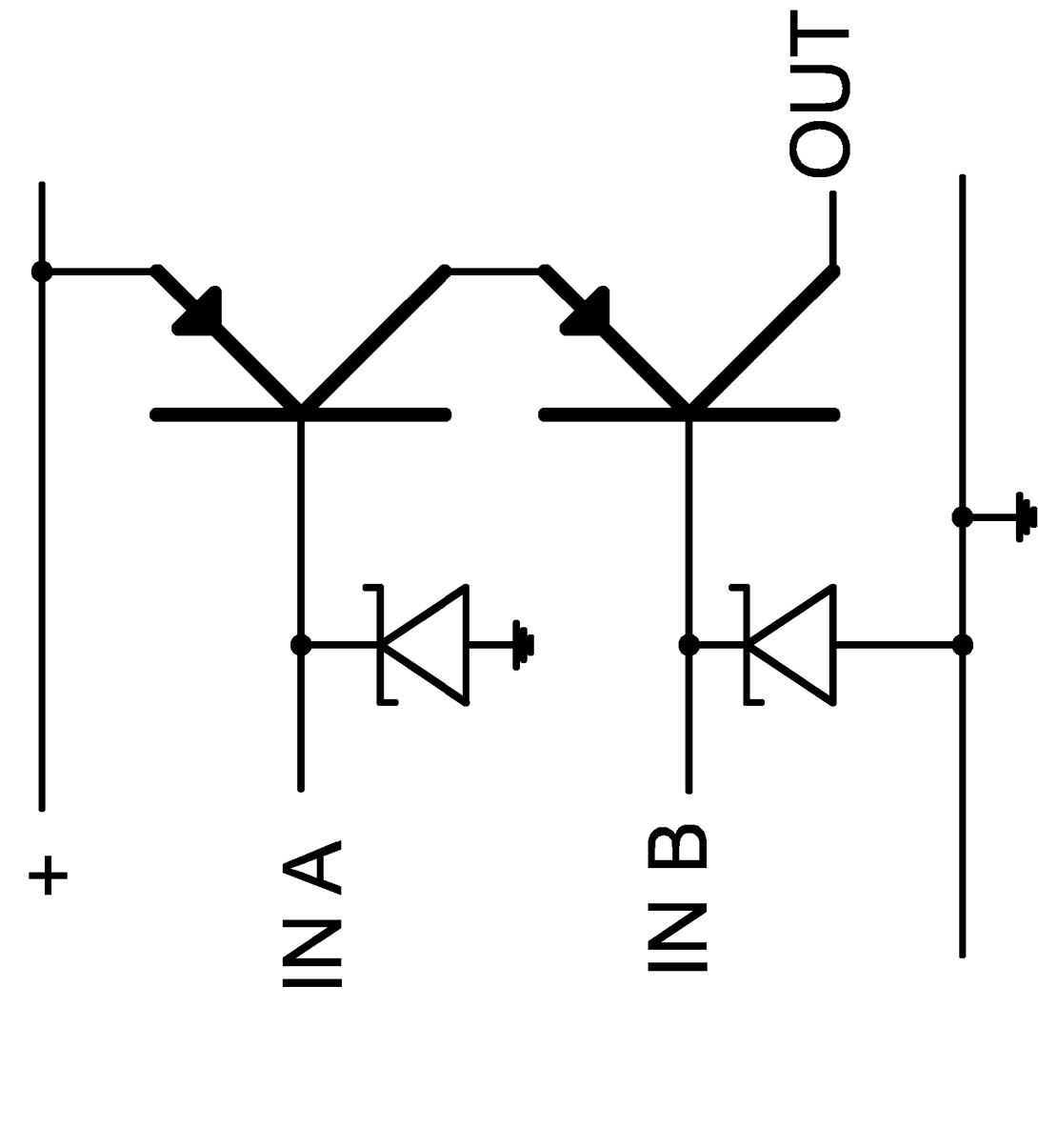
FIG. 5 is a schematic of an example circuit to implement a NOR gate comprised of normally ON transistors implemented using two of the circuits of FIG. 1.

FIGS. 3, 4, and 5, illustrate example circuits, according to various embodiments, comprised from combining multiple inverter logic circuits of FIG. 1 to implement other functions.

The example circuit of FIG. 3 comprises two inverter circuits of FIG. 1 arranged with the output of a first of them (left hand side) provided by the collector of the transistor of the first circuit providing an input connected to the base of the transistor of the second circuit (right hand side) to implement a buffer circuit.

The example circuit of FIG. 4 implements a NAND logic gate. It comprises two inverter circuits of FIG. 1 in which each is arranged to receive a different input: INA, INB. The outputs of the two circuits, i.e., output from collectors of respective transistors, are connected together to provide an output of the logic circuit.

The example circuit of FIG. 5 implements a NOR logic gate. It comprises two inverter circuits of FIG. 1 in which each is arranged to receive a different input: INA, INB. The output of the collector of the transistor of the first circuit (above) is connected to the emitter of the transistor of the second circuit (below). The collector of the transistor of the second circuit provides the output of the logic circuit.

It will be appreciated that any of the circuits of FIGS. 3 to 5 could be implemented instead by combining multiples of the circuit of FIG. 2.

Figures 6A, 6B:
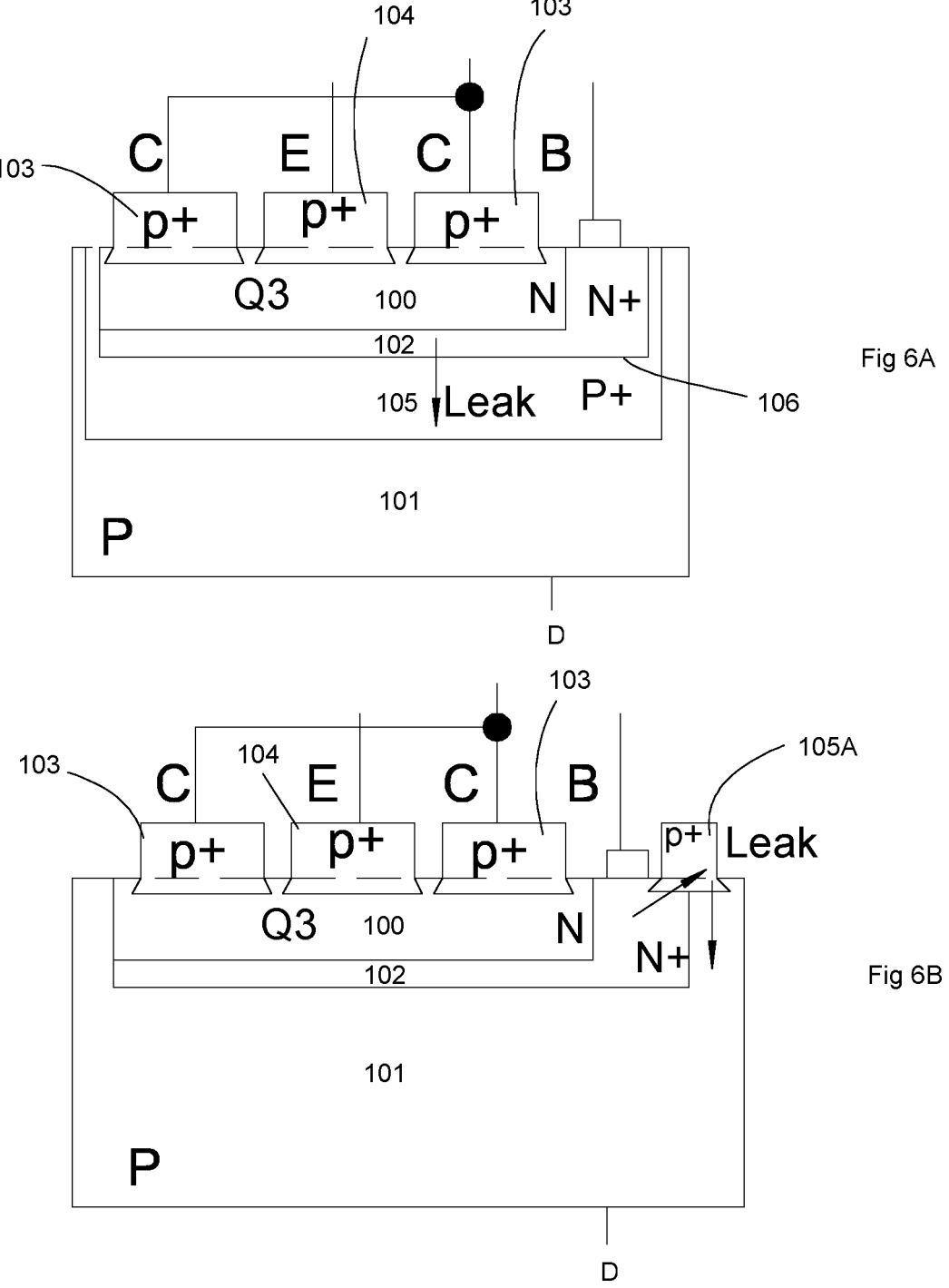
FIGS. 6A, 6B and 6C are example cross section side views of variant semiconductor layer structures to provide a lateral PNP bipolar transistor and zener diode.
Figure 6C:
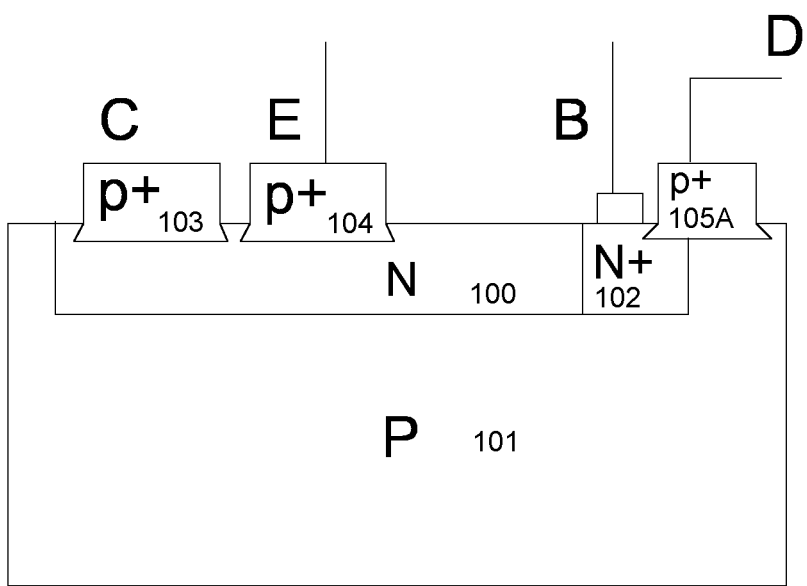

FIGS. 6A, 6B, 6C are schematics of variant example semiconductor layer structures to implement the PNP bipolar junction transistor and zener diode of FIG. 1.

With reference to FIG. 6A, a lateral bipolar junction transistor is provided from a first n-type semiconductor region 100, which provides a base region of the transistor, formed in a p-type layer 101 (e.g., substrate in which multiple regions 100 may be provided and isolated from one another by the substrate to form multiple transistor zener diode circuit devices). A portion of the n-type region 100 is heavily doped to provide an n+ type region 102. The n+ region 102 is in contact with the both the p substrate 101 and a base contact B of the transistor. The n+ region 102 extends beneath the less heavily doped part of the n-type region 100.

A pattern of polysilicon is provided on the n-type region 100 (e.g., on the surface of the silicon wafer) to define separate p-type regions 103, 104 that provide the collector and emitter regions of the transistor. Contacts for the collector and base are provided on region 103, 104 to provide emitter and connector contacts.

The p-type 103, 104 regions are favorably manufactured by depositing undoped or lightly doped polysilicon on the wafer and then doping in situ. The conditions of the doping process favorably cause portions of the n-type region 100 immediately adjacent the polysilicon to be counter-doped so that they form part of the p-type regions 103, 104.

A portion of the p-type substrate 101 is heavily doped to provide a further p+ region 105 that is in direct contact with the n+ region 102 of the base to form a diode junction 106 which provides, by virtue of their high doping levels, the zener diode. An electrical contact D is provided on the p substrate 101 to provide the second terminal of the zener diode.

FIG. 6B shows a variant example structure in which the further p+ region 105 of FIG. 6A which forms one half of the zener diode, is provided instead by a heavily doped poly-silicon layer 105A deposited on the surface of the doped silicon wafer (e.g., in the same process that created p-type regions 103, 104). The polysilicon layer 105A extends laterally across a PN junction within the wafer between the n+ base region 102 of the transistor and the relatively lightly doped p-type substrate 100 (though in a variant it may extend over the p-type substrate only). As before, undoped or relatively lightly doped polysilicon may be deposited on the silicon wafer and then doped in situ to form a heavily doped p-type layer (p+ layer). Favorably the doping conditions are selected to convert a portion of the p-type substrate immediately adjacent the n+ layer 102 so as to form part of the heavily doped p+ layer 105A.

The provision of a base region comprising an n region 100 that has beneath it a buried n+ type region reduces the efficiency of any parasitic vertical transistors inadvertently created as a result of the lateral transistor structure. However, providing this layer structure is complex because it is difficult to create lightly doped material in a region that is already heavily doped. Nevertheless this could be done using multiple epitaxial layers, e.g., by placing a N+ layer across the entire wafer, then a lighter N layer.

FIG. 6C illustrates a further variant example structure, similar to that of FIG. 6B in which the n+ region 102 of the base lies adjacent the n region 100 of the base but does not extend beneath it. This structure is easier to form compared with that of FIG. 6B as the n+ region 102 can be easily formed after the n-region 100 is formed through a further doping process. A further difference of this embodiment to that of FIG. 6A is that the second terminal D of the diode is connected directly to the p+ layer 105A rather than on the p substrate 101 allowing it to be provided on the same side of the wafer as the base, emitter and collector terminals.

A low energy P-type ion implant may be used to reduce the N type material 100 at the surface of the wafer. This allows a higher concentration of N dopant to be used to form 100, reducing the gain of a vertical parasitic transistor, while keeping the lateral transistor gain high.

It will be appreciated that the variants structures of FIGS. 6A to 6C can be adapted to form NPN bi-polar transistors with zener diodes by swapping the layer types around.

The use of a zener diode in a reverse biased arrangement with a voltage across it that is below its zener voltage is preferred because it provides operationally stability, especially when the zener voltage is selected to minimize the diode thermal coefficient. Nevertheless, other diode configurations are possible. For example where the diode is small enough and thus highly current limiting, it may be used in a normal biased arrangement. It is also possible that other type of diode be used, e.g., tunnel diodes. A tunnel diode may be used in a forward biased condition with the voltage across the diode being below the higher voltage that demarks the negative resistance region of the tunnel diode.

It will be appreciated that the above describes only a few example configurations of a transistor device and associated circuitry and that the actual operations performed by the transistor device and associated circuitry can be selected by the user depending on the intended function of the transistor device.

What is claimed is:

1. A semiconductor device comprising:
a bipolar transistor comprises:
first and second regions of a first type of semiconductor material that provide collector and emitter regions of the bipolar transistor, and a first region of a second type of semiconductor material, which provides a base region of the bipolar transistor, interposed between and in contact with each of the first and second regions of the first type of semiconductor material, the first region of the second type of semiconductor material comprising a relatively highly doped portion; and
a diode comprises:
the relatively highly doped portion of the first region of the second type of semiconductor material; and
a further region of the first type of semiconductor material that is non-contiguous with the first and second regions of the first type of semiconductor material, the further region of the first type of semiconductor material being in contact with a highly doped portion of the first region of the second type of semiconductor material to form a diode junction; and
the semiconductor device comprises an electrical terminal connected to the further region of the first type of semiconductor that provides a terminal of the diode.

2. The semiconductor device according to claim 1 wherein the diode is comprised from a portion of the first region of the second type that is relatively highly doped compared with a remainder of the first region of the second type.

3. The semiconductor device according to claim 2 comprising a base contact for the bipolar transistor, the base contact being in direct contact with the relatively highly doped portion of the first region of the second type.

4. The semiconductor device according to claim 1 wherein the relatively highly doped portion of the first region of the second type of semiconductor material and the further region of the first type of semiconductor material provide a zener diode.

5. The semiconductor device according to claim 1 wherein the bipolar transistor is a lateral bipolar junction transistor, the first and second regions of the first type of semiconductor material being laterally spaced apart from one another about the first region of the second type and lie on a same side as the first region of the second type of semiconductor material.

6. The semiconductor device according to claim 1 wherein the further region of the first type of semiconductor material is provided by a semiconductor layer that has been deposited onto a semiconductor wafer which defines, at least in part, the first region of the second type of semiconductor material that provides the base region of the bipolar transistor.

7. The semiconductor device according to claim 1 the first and second regions of the first type of semiconductor material are provided by a semiconductor layer deposited onto a semiconductor wafer which defines, at least in part, the first region of the second type of semiconductor material that provides the base region of the bipolar transistor.

8. The semiconductor device according to claim 1 wherein the further region of the first type of semiconductor material comprises a first portion that is highly doped and together with the first region of the second type of semiconductor material provides the diode, and a second portion which is lightly doped relative to the first portion and provides a substrate layer.

9. The semiconductor device according to claim 8 comprising multiple first regions of the second type within the substrate layer and isolated from one another by the substrate layer.

* * * * *